(12) United States Patent
Chen

(10) Patent No.: US 12,147,334 B2
(45) Date of Patent: Nov. 19, 2024

(54) APPARATUS AND METHOD FOR SEARCHING FOR LOGICAL ADDRESS RANGES OF HOST COMMANDS

(71) Applicant: Silicon Motion, Inc., Zhubei (TW)

(72) Inventor: Chun-Yu Chen, Taitung County (TW)

(73) Assignee: SILICON MOTION, INC., Zhubei (TW)

( * ) Notice: Subject to any disclaimer, the term of this patent is extended or adjusted under 35 U.S.C. 154(b) by 0 days.

(21) Appl. No.: 18/369,046

(22) Filed: Sep. 15, 2023

(65) Prior Publication Data

US 2024/0176734 A1    May 30, 2024

(30) Foreign Application Priority Data

Nov. 24, 2022  (CN) .......................... 202211479927.9

(51) Int. Cl.
*G06F 12/02* (2006.01)
*G06F 12/06* (2006.01)
*H03K 3/037* (2006.01)

(52) U.S. Cl.
CPC ...... *G06F 12/0246* (2013.01); *G06F 12/0653* (2013.01); *H03K 3/037* (2013.01)

(58) Field of Classification Search
CPC .......................... G06F 12/0246; G06F 12/0653
See application file for complete search history.

(56) References Cited

U.S. PATENT DOCUMENTS

| | | |
|---|---|---|
| 2007/0147115 A1 | 6/2007 | Lin et al. |
| 2007/0233933 A1 | 10/2007 | Wang et al. |
| 2009/0157946 A1 | 6/2009 | Arya |
| 2017/0123990 A1 | 5/2017 | Jung et al. |
| 2021/0240394 A1* | 8/2021 | Mahurin ............... G06F 3/0622 |
| 2021/0311660 A1* | 10/2021 | Saxena ................. G06F 3/0659 |

FOREIGN PATENT DOCUMENTS

| | | |
|---|---|---|
| TW | 200745851 A | 12/2007 |
| TW | 200745858 A | 12/2007 |
| TW | 201715401 A | 5/2017 |

* cited by examiner

*Primary Examiner* — Ryan Bertram
(74) *Attorney, Agent, or Firm* — Birch, Stewart, Kolasch & Birch, LLP

(57) ABSTRACT

The invention relates to an apparatus for searching for logical address ranges of host commands. The first comparator outputs logic "0" to the NOR gate when a first end logical address is not smaller than a second start logical address. The second comparator outputs logic "0" to the NOR gate when a second end logical address is not smaller than a first start logical address. The NOR gate outputs logic "1" to a matching register and an output circuitry when receiving logic "0" from both the first and the second comparators. The output circuitry outputs a memory address of a random access memory (RAM) storing a second logical address range from the second start logical address to the second end logical address to a resulting address register when receiving logic "1" from the NOR gate.

20 Claims, 8 Drawing Sheets

APPARATUS AND METHOD FOR SEARCHING FOR LOGICAL ADDRESS RANGES OF HOST COMMANDS

CROSS-REFERENCE TO RELATED APPLICATIONS

This application claims the benefit of priority to Patent Application No. 202211479927.9, filed in China on Nov. 24, 2022; the entirety of which is incorporated herein by reference for all purposes.

BACKGROUND

The disclosure generally relates to storage devices and, more particularly, to an apparatus and a method for searching for logical address ranges of host commands.

Flash memory devices typically include NOR flash devices and NAND flash devices. NOR flash devices are random access-a central processing unit (CPU) accessing a NOR flash device can provide the device any address on its address pins and immediately retrieve data stored in that address on the device's data pins. NAND flash devices, on the other hand, are not random access but serial access. It is not possible for NAND to access any random address in the way described above. Instead, the CPU has to write into the device a sequence of bytes which identifies both the type of command requested (e.g. read, write, erase, etc.) and the address to be used for that command. The address identifies a page (the smallest chunk of flash memory that can be written in a single operation) or a block (the smallest chunk of flash memory that can be erased in a single operation), and not a single byte or word.

However, the data to be programmed into a flash module may be temporarily stored in a random access memory (RAM) of the flash controller for a time period before an actual programming operation. The temporarily stored data may be read by subsequent host read commands. If the temporarily stored data can be directly read from the RAM and returned to the host side, instead of performing actual read operation from the flash module through a flash interface, the execution time of the host read command would be shortened. Or, the temporarily stored data may be overwritten by subsequent host update commands (e.g. write commands, erase commands, discard commands, etc.). If the data temporarily stored in the RAM can be directly updated, the execution time of the host update commands would be shortened. Thus, it is desirable to have an apparatus and a method for searching for logical address ranges of host commands to determine whether logical address ranges of subsequent host commands hit the logical address ranges of temporarily stored data, thereby enabling the execution time of the host commands to be reduced.

SUMMARY

In an aspect of the invention, an embodiment introduces an apparatus for searching for logical address ranges of host commands to include: a second start register; a second end register; a first comparator; a second comparator; a NOR gate; and an output circuitry. The second start register stores a second start logical address and the second end register stores a second end logical address. The output terminal of the first comparator is arranged operably to output logic "0" to a NOR gate when a first end logical address stored in the first end register is not smaller than the second start logical address. The output terminal of the second comparator is arranged operably to output logic "0" to the NOR gate when the second end logical address is not smaller than a first start logical address stored in the first start register. The output terminal of the NOR gate is arranged operably to output logic "1" to a matching register and an output circuitry when both input terminals of the NOR gate receive logic "0". The output circuitry is arranged operably to output a memory address of a random access memory (RAM) storing a second logical address range from the second start logical address to the second end logical address to a resulting address register when receiving logic "1" from the NOR gate.

In another aspect of the invention, an embodiment introduces a method for searching for logical address ranges of host commands to include: inputting a first logical address range from a first start logical address to a first end logical address; inputting a second logical address range from a second start logical address to a second end logical address, where to-be-programmed data of the second logical address range is temporarily stored in a RAM but hasn't been programmed into a flash module; outputting, by a first comparator, logic "0" to a NOR gate when detecting that the first end logical address is not smaller than the second start logical address; outputting, by a second comparator, logic "0" to the NOR gate when detecting that the second end logical address is not smaller than the first start logical address; outputting, by the NOR gate, logic "1" to a matching register to notify a processing unit that a whole or a portion of data of the first logical address range is temporarily stored in the RAM, and outputting, by the NOR gate, logic "1" to an output circuitry to allow the output circuitry to output a memory address of the RAM storing the second logical address range to a resulting address register when receiving logic "0" from both the first comparator and the second comparator.

Both the foregoing general description and the following detailed description are examples and explanatory only, and are not restrictive of the invention as claimed.

DETAILED DESCRIPTION

Reference is made in detail to embodiments of the invention, which are illustrated in the accompanying drawings.

The same reference numbers may be used throughout the drawings to refer to the same or like parts, components, or operations.

The present invention will be described with respect to particular embodiments and with reference to certain drawings, but the invention is not limited thereto and is only limited by the claims. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent." etc.)

Figure 1:
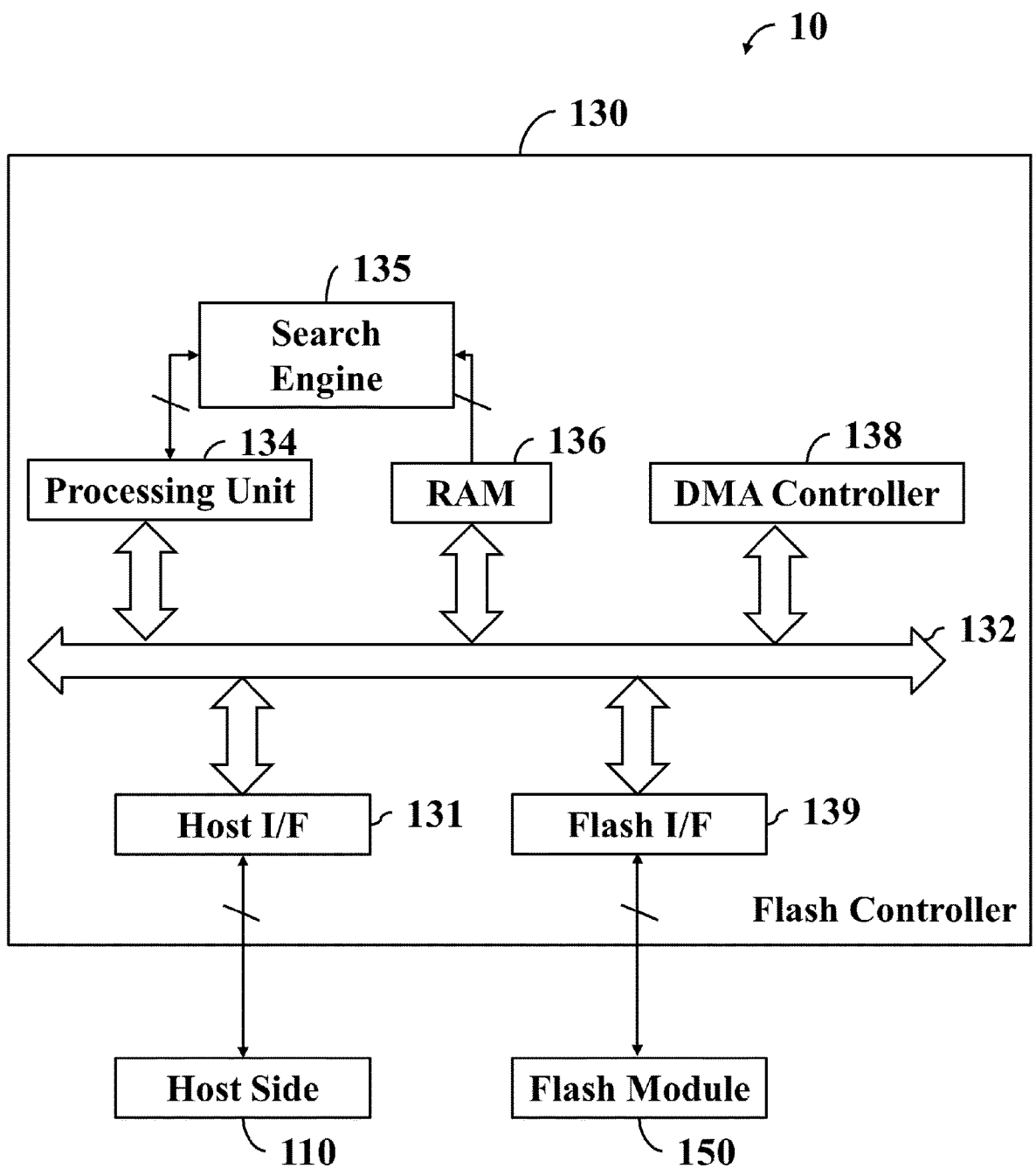
FIG. 1 is the system architecture of an electronic apparatus according to an embodiment of the invention.

Refer to FIG. 1. The electronic apparatus 100 includes the host side 110, the flash controller 130 and the flash module 150, and the flash controller 130 and the flash module 150 may be collectively referred to as a device side. The electronic apparatus 100 may be equipped with a Personal Computer (PC), a laptop PC, a tablet PC, a mobile phone, a digital camera, a digital recorder, a smart television, a smart freezer, an automotive electronics system, or other consumer electronic products. The host side 110 and the host interface (I/F) 131 of the flash controller 130 may communicate with each other by Universal Serial Bus (USB), Advanced Technology Attachment (ATA), Serial Advanced Technology Attachment (SATA), Peripheral Component Interconnect Express (PCI-E), Universal Flash Storage (UFS), Non-Volatile Memory Express (NVMe), Embedded Multi-Media Card (eMMC) protocol, or others. The flash I/F 139 of the flash controller 130 and the flash module 150 may communicate with each other by a Double Data Rate (DDR) protocol, such as Open NAND Flash Interface (ONFI), DDR Toggle, or others. The flash controller 130 includes the processing unit 134 and the processing unit 134 may be implemented in numerous ways, such as with general-purpose hardware (e.g., a microcontroller unit, a single processor, multiple processors or graphics processing units capable of parallel computations, or others) that is programmed using firmware and/or software instructions to perform the functions recited herein. The processing unit 134 may receive host commands from the host side 110 through the host I/F 131, such as read commands, write commands, discard commands, erase commands, etc., schedule and execute the host commands. The flash controller 130 includes the Random Access Memory (RAM) 136, which may be implemented in a Dynamic Random Access Memory (DRAM), a Static Random Access Memory (SRAM), or the combination thereof, for allocating space as a data buffer storing user data (also referred to as host data) that has been obtained from the host side 110 and is to be programmed into the flash module 150, and that has been read from the flash module 150 and is to be output to the host side 110. The RAM 136 stores necessary data in execution, such as variables, data tables, data abstracts, host-to-flash (H2F) tables, flash-to-host (F2H) tables, or others. The flash I/F 139 includes a NAND flash controller (NFC) to provide functions that are required to access to the flash module 150, such as a command sequencer, a Low Density Parity Check (LDPC) encoder/decoder, etc.

The flash controller 130 may be equipped with the bus architecture 132 to couple components to each other to transmit data, addresses, control signals, etc. The components include but not limit to the host I/F 131, the processing unit 134, the RAM 136, the direct memory access (DMA) controller 138 and the flash I/F 139. The DMA controller 138 moves data between the components through the bus architecture 132 according to the instructions issued by the processing unit 134. For example, the DMA controller 138 may migrate data in a specific data buffer of the host I/F 131 or the flash I/F 139 to a specific address of the RAM 136, migrate data in a specific address of the RAM 136 to a specific data buffer of the host I/F 131 or the flash I/F 139, and so on.

The flash module 150 provides huge storage space typically in hundred Gigabytes (GBs), or even several Terabytes (TBs), for storing a wide range of user data, such as high-resolution images, video files, etc. The flash module 150 includes control circuitries and memory arrays containing memory cells, such as being configured as Single Level Cells (SLCs), Multi-Level Cells (MLCs), Triple Level Cells (TLCs), Quad-Level Cells (QLCs), or any combinations thereof. The processing unit 134 programs user data into a designated address (a destination address) of the flash module 150 and reads user data from a designated address (a source address) thereof through the flash I/F 139. The flash I/F 139 may use several electronic signals including a data line, a clock signal line and control signal lines for coordinating the command, address and data transfer with the flash module 150. The data line may be used to transfer commands, addresses, read data and data to be programmed; and the control signal lines may be used to transfer control signals, such as Chip Enable (CE), Address Latch Enable (ALE), Command Latch Enable (CLE), Write Enable (WE), etc.

Figure 2:
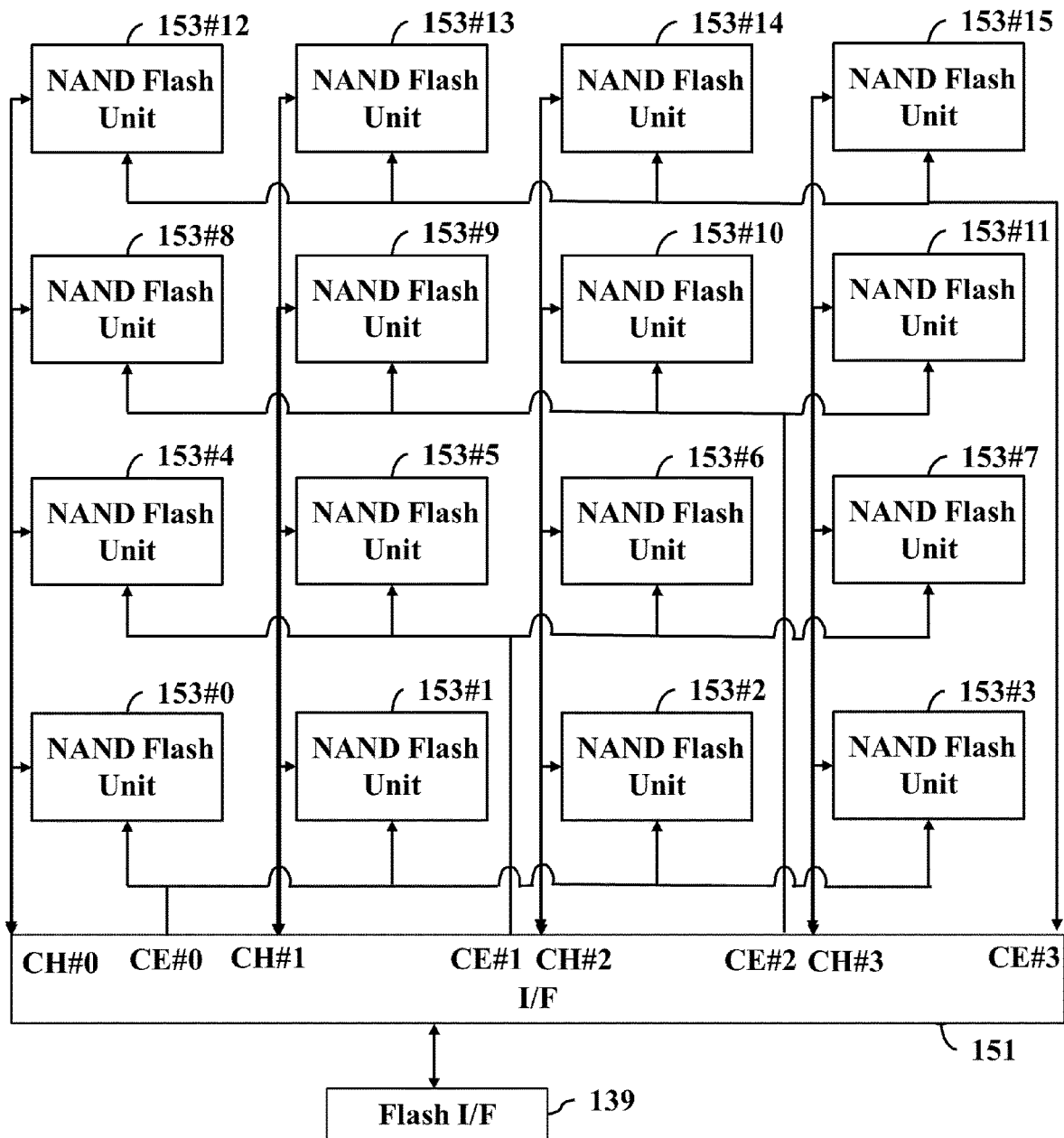
FIG. 2 is a schematic diagram illustrating a flash module according to an embodiment of the invention.

Refer to FIG. 2. The I/F 151 of the flash module 150 may include four I/O channels (hereinafter referred to as channels) CH #0 to CH #3 and each is connected to four NAND flash modules, for example, the channel CH #0 is connected to the NAND flash units 153 #0, 153 #4, 153 #8 and 153 #12. Each NAND flash unit can be packaged in an independent die. The flash I/F 139 may issue one of the CE signals CE #0 to CE #3 through the I/F 151 to activate the NAND flash modules 153 #0 to 153 #3, the NAND flash modules 153 #4 to 153 #7, the NAND flash modules 153 #8 to 153 #11, or the NAND flash modules 153 #12 to 153 #15, and read data from or program data into the activated NAND flash modules in parallel.

The processing unit 134 when loading and executing program code of firmware translation layer (FTL) executes different types of host commands issued by the host side 110 and performs background operations to improve the overall performance of the storage device. The background operations may include the garbage collection (GC), the wear leveling (WL), the read reclaim and the read refresh processes, and so on. Each time when the FTL drives the host I/F 131 to obtain a sequential update command from the host side 110, the FTL pushes multiples logical addresses carried in the sequential update command into a sequential update queue and temporarily stores the to-be-programmed data for the sequential update command in a data buffer of the RAM 136. Subsequently, each time when the FTL receives a host command (such as a read command, a write command, an erase command, a discard command, etc.) from the host side 110 through the host I/F 131, the FTL searches the entries in the sequential update queue to determine whether the logical address, or the whole or a portion of the logical address range carried in the host command has been recorded in the sequential update queue. If it happens, it means that the RAM 136 temporarily stores the data of the hit logical address or the hit logical address range, but the data hasn't been programmed into the flash module 150. The FTL may manipulate the data temporarily stored in the RAM 136 for accelerating the execution of this host command.

In some embodiments, the sequential update queue is arranged to store one logical address in each entry. The logical addresses may be represented as logical block address (LBA) numbers and each LBA number points to 512-byte data. Or, the logical addresses may be represented as host page numbers and each host page number points to 4K-byte data. For example, if the sequential update command instructs the flash controller 130 to write data of LBA #0x1000 to LBA #0x13FF, the FTL pushes 1024 entries including logical addresses "0x1000" to "0x13FF" sequentially into the sequential update queue. However, the described implementations allocate larger space in the RAM 136 for the sequential update queue. Moreover, each time when the FTL receives a host command from the host side 110 through the host I/F 131, it consumes excessive time to search and compare numerous entries in the sequential update queue to determine whether at least one logical location carried in this host command is presented in the sequential update queue.

Figure 3:
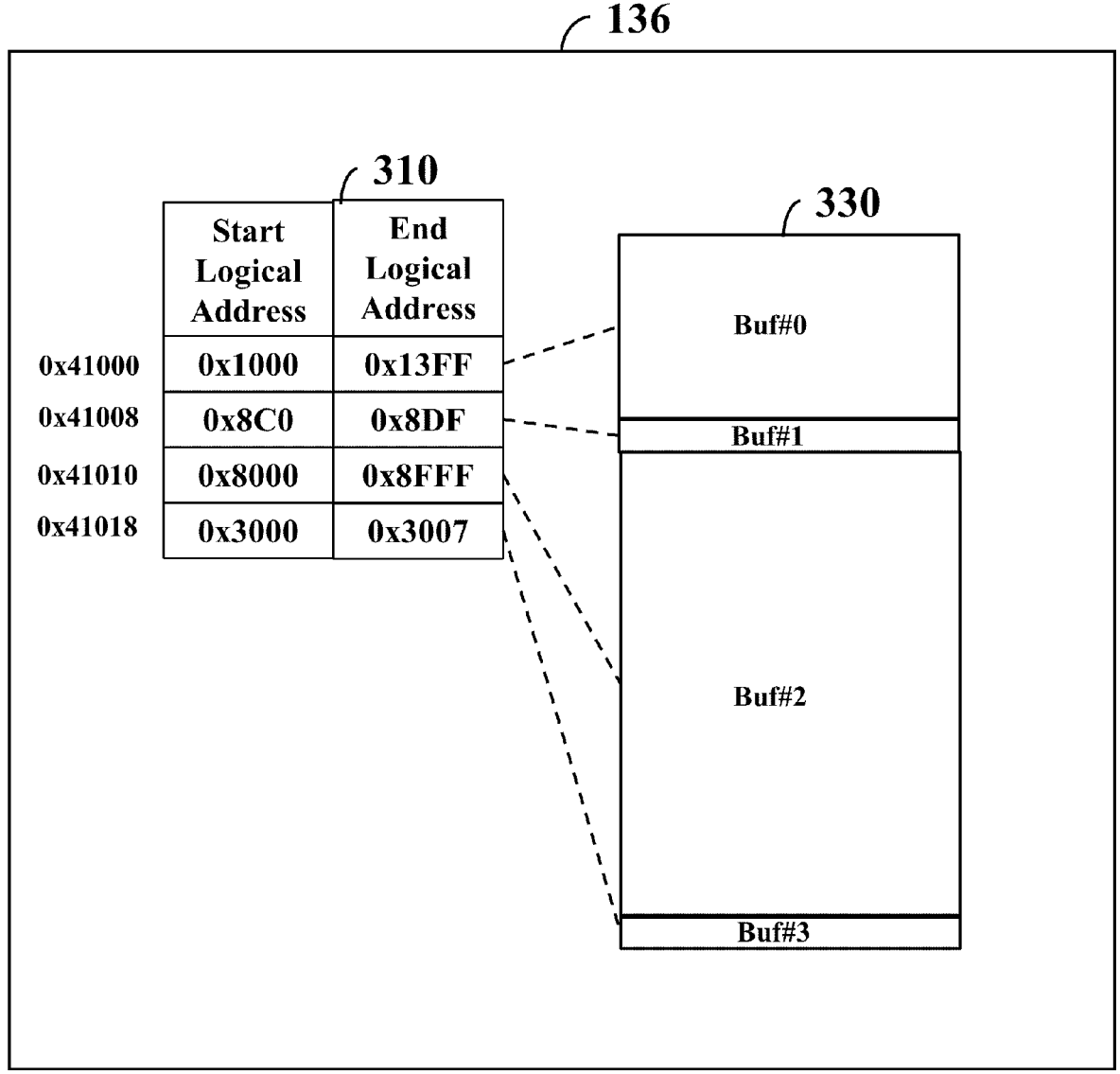
FIG. 3 is a schematic diagram showing the relations between the exemplary entries in a sequential update queue and the exemplary space allocations in a data buffer according to an embodiment of the invention.

To reduce the space consumption of the RAM 136, an embodiment of the present invention introduces a compact data structure to express each entry in the sequential update queue. Each entry stores a logical address range including a start address and an end address. Refer to FIG. 3 showing a schematic diagram of allocating memory space. Space in the RAM 136 is allocated for the sequential update queue 310 and the data buffer 330. The sequential update queue 310 stores pairs of the start address and the end address corresponding to sequential update commands sent by the host side 110 according to the time sequence of the sequential update commands arriving at the flash controller 130. The sequential update command may be a host write command, a host erase command, a host discard command, etc. with a logical address length greater than 1. The sequential update queue 310 may store hundreds or thousands logical address ranges of the sequential update commands. The principle operations on the sequential update queue 310 are the addition of logical address ranges of the sequential update commands to the rear terminal position, known as enqueue, and the removal of logical address ranges of the sequential update commands from the front terminal position, known as dequeue. That is, the first logical address range added to the queue will be the first one to be removed, which conforms to the First-In First-Out (FIFO) principle. For example, each entry in the sequential update queue 310 may store the start logical address of 4 bytes and the end logical address of 4 bytes to indicate continuous logical addresses. The address "0x41000" of the RAM 136 stores the start logical address "0x1000" and the end logical address "0x13FF" of the 0th sequential update command, the address "0x41008" of the RAM 136 stores the start logical address "0x8C0" and the end logical address "0x8DF" of the 1$^{st}$ sequential update command, and so on. The start logical address "0x1000" and the end logical address "0x13FF" indicate 1024 continuous logical addresses, the start logical address "0x8C0" and the end logical address "0x8DF" indicate 32 continuous logical addresses, and so on. The sequential update queue 310 may be designed as a cyclical queue.

The data buffer 330 is utilized to store the data to be programmed for the sequential update commands. For example, the space Buf #0 of the data buffer 330 stores the to-be-programmed data for the 0$^{th}$ host write command with the logical address range from "0x1000" to "0x13FF"; the space Buf #1 of the data buffer 330 stores the to-be-programmed data for the 1$^{st}$ host write command with the logical address range from "0x8C0" to "0x8DF", and so on. The RAM 136 may further store a host-command basic-data table (not shown in FIG. 3) including multiple entries and each entry records a command number, a command type, a continuity, a start memory address for storing the logical address range in the sequential update queue 310, a start memory address for storing to-be-programmed data in the data buffer 330, etc. for one host command. The command type may include read "R", write "W", erase "E", discard "D", etc. The continuity may include sequential "Sqt", random "Rnd", etc. The FTL knows which memory space in the data buffer 330 that the data to be programmed corresponding to each logical address range in the sequential update queue 310 is actually stored in through the host-command basic-data table.

Figure 4:
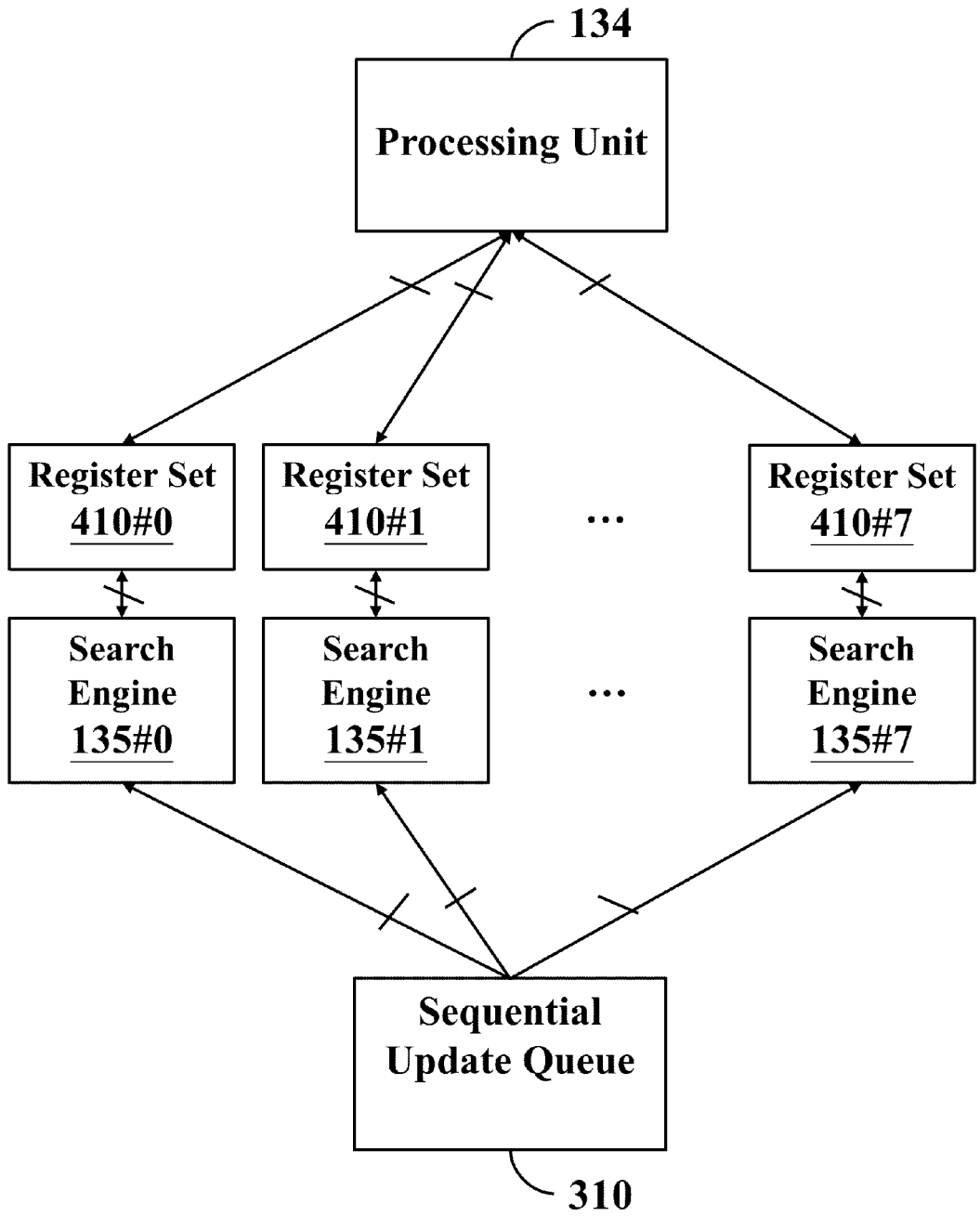
FIG. 4 is a schematic diagram of multiple search engines and the corresponding register sets according to an embodiment of the invention.

Refer to FIG. 4. Eight dedicated search engines 135 #0 to 135 #7 and corresponding register sets 410 #0 to 410 #7 can be set in the flash controller 130, so that the processing unit 134 when executing firmware to process host commands sets the designated registers in the register sets 410 #0 to 410 #7 to drive the search engines 135 #0 to 135 #7 for performing the search tasks for eight address ranges in parallel. After driving the search engines 135 #0 to 135 #7 to start working, the processing unit 134 interrupts the execution of this host command and jumps to execute another host command or background operations without waiting for the execution results for these eight search tasks. For the sake of brevity, if the search engine 135 is mentioned in the entire disclosure, it means any one of the search engines 135 #0 to 135 #7. If the register set 410 is mentioned in the entire disclosure, it means any of or a corresponding one of the register sets 410 #0 to 410 #7. The search engine 135 may obtain the search logical address range in the corresponding register set 410 and compare the entries in the sequential update queue 310 one by one until the whole or a portion of search logical address range is appeared in any entry, or until all the entries are compared and the search logical address range is not found in the entries. Whenever the search engine 135 detects that the whole or a portion of search logical address range is appeared in any entry, the search engine 135 sets the designated register in the corresponding register set 410 to notify the processing unit 134 of the successful search message and the searched entry. When the search engine 135 compares all the entries and does not find the search logical address range in the entries, the search engine 135 sets the designated register in the corresponding register set 410 to notify the processing unit 134 of the search failure message. The processing unit 134 can read the search results from the designated registers in the register sets 410 #0 to 410 #7 after a period of time, and continue to execute this host command according to the search results.

Since the processing unit 134 does not need to execute the eight search tasks and can provide its computing resources to other tasks, the overall performance of the storage device is improved. Although the disclosure describes eight dedicated search engines and the eight corresponding register sets, those artisans may install more or less dedicated search engines and their corresponding register sets in the flash controller 130 depending on different system requirements, the invention should not be limited thereto.

Figure 5:
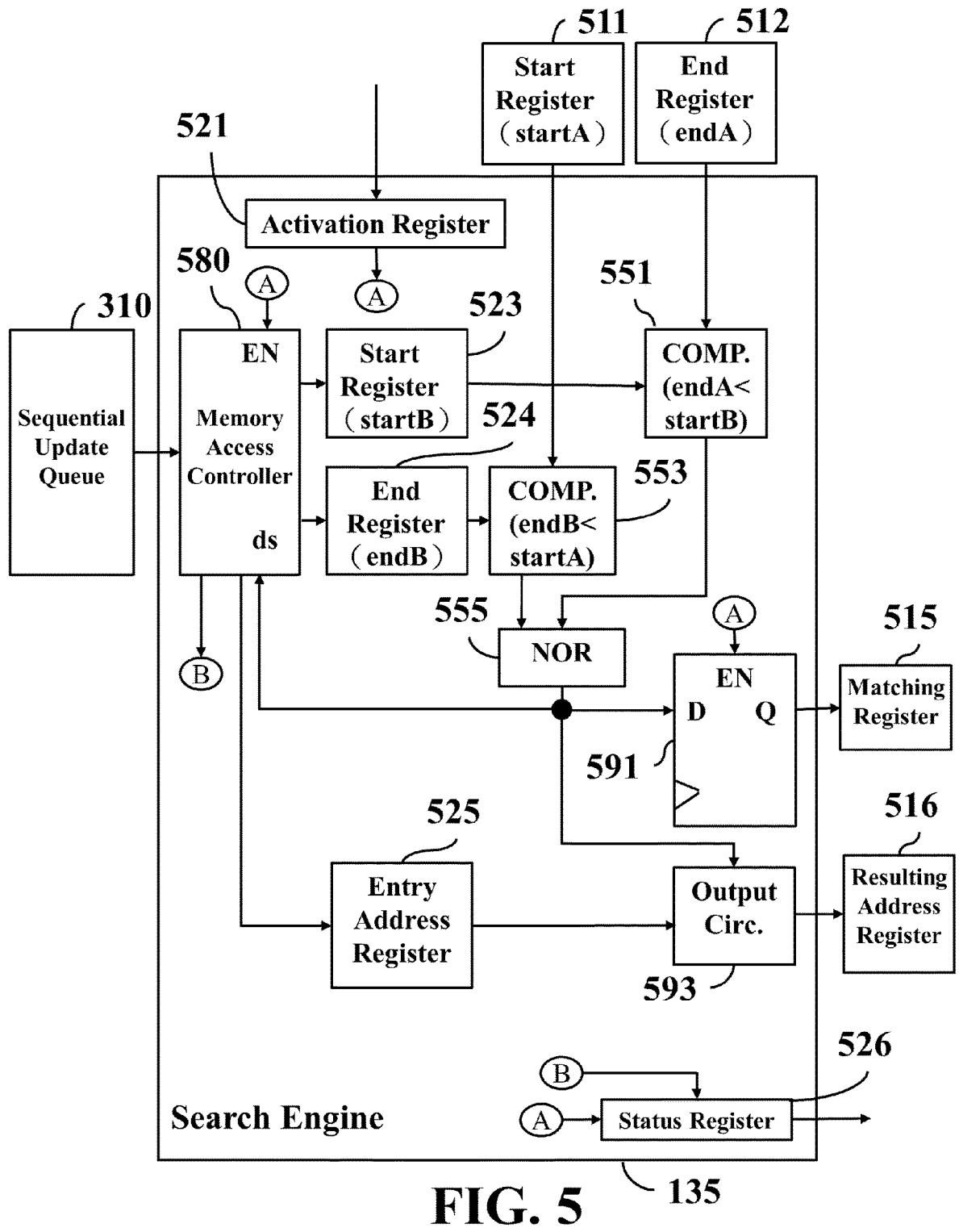
FIG. 5 is a block diagram showing the search engine and the surrounding components according to an embodiment of the invention.

Refer to FIG. 5 showing a block diagram of the search engine 135 and the surrounding components. The processing unit 134 may store the exemplary entries of the sequential update queue 310 as shown in FIG. 3 in the RAM 136 and set the values "startA" and "endA" of the start register 511 and the end register 512 to define a logical address range for search. The processing unit 134 may set the activation register 521 to drive the search engine 135 for accelerating the execution of a received host command. The processing unit 134 may interrupt the execution of this host command and start the processing for other tasks after triggering a timer to count for a period of time. The start register 511 and the end register 512 may be integrated in the processing unit 134 or the search engine 135.

Initially, the matching register 515 and the resulting address register 516 store null values. After the processing unit 134 sets the activation register 521 to logic "1", the activation register 521 outputs logic "1" to the memory access controller 580 and the flip-flop 591 to enable the memory access controller 580 and the flip-flop 591. Additionally, the activation register 521 outputs logic "1" to the status register 526, which means that the search engine 135 is currently in the busy state. Each time when the clock signal toggles, the memory access controller 580 reads 8 bytes from the start address of the first or the next entry in the sequential update queue 310 (for example, the memory address "0x41000" of the RAM 136), and stores the value of the first bytes in the start register 523 as the start logical address "startB" and the value of the last bytes in the end register 524 as the end logical address "endB". The memory access controller 580 stores the start address of the first or the next entry in the sequential update queue 310 in the entry address register 525. The comparator 551 determines whether the value "endA" of the end register 512 is smaller than the value "startB" of the start address 523. If so, the comparator 551 outputs logic "1" to the NOR gate 555 to indicate that the logical address range in the read entry is not overlapped with the logical address range that the processing unit 134 attempts to search for (representing no hit). Otherwise, the comparator 551 outputs logic "0" to the NOR gate 555. The comparator 553 determines whether the value "endB" of the end register 524 is smaller than the value "startA" of the start address 511. If so, the comparator 553 outputs logic "1" to the NOR gate 555 to indicate that the logical address range in the read entry is not overlapped with the logical address range that the processing unit 134 attempts to search for (representing no hit). Otherwise, the comparator 553 outputs logic "0" to the NOR gate 555. When receiving logic "1" from the comparator 551 or the comparator 553, the NOR gate 555 outputs logic "0" to the D flip-flop 591, the output circuitry 593 and the memory access controller 580, so that the output circuitry 530 outputs logic "0" to the matching register 515 (representing no hit), the output circuitry 593 is not allowed to output a result, and the memory access controller 580 continues to read the logical address range from the next retry of the sequential update queue 310. When receiving logic "0" from both the comparator 551 and the comparator 553, the NOR gate 555 outputs logic "1" to the D flip-flop 591, the output circuitry 593 and the memory access controller 580, so that the output circuitry 530 outputs logic "1" to the matching register 515 (representing a hit), the output circuitry 593 stores the value of the entry address register 525 in the resulting address register 516 as the searched result (that is, the start address of the hit entry in the RAM 136), and the memory access controller 580 is disabled. After the memory access controller 580 searches for the last entry of the sequential update queue 310 or is disabled, the memory access controller 580 outputs logic "0" to the status register 526 to indicate that that the search engine 135 is currently in the idle state. The matching register 515 and the resulting address register 516 may be integrated in the processing unit 134 or the search engine 135.

After the timer counts to the end of this time period, the processing unit 134 may check the status register 526 to determine whether the search engine 135 is currently in the busy state (representing that the search is in progress) or the idle state (representing that the search has completed). If the search engine 135 is currently in the busy state, then the processing unit 134 resets the timer to count for a period of time. If the search engine 135 is currently in the idle state, then the processing unit 134 reads the value of the matching register 515. The value of the matching register 515 being logic "0" indicates that no entry including a logical address range overlapping with the logical address range from startA to endB is found in the sequential update queue 310. The value of the matching register 515 being logic "1" indicates that an entry including a logical address range overlapping with the logical address range from startA to endA is found in the sequential update queue 310, and the processing unit 134 reads the memory address stored in the resulting address register 516. Subsequently, the processing unit 134 reads 8 bytes starting from the read memory address of the RAM 136 to obtain the hit logical address range.

Figure 6:
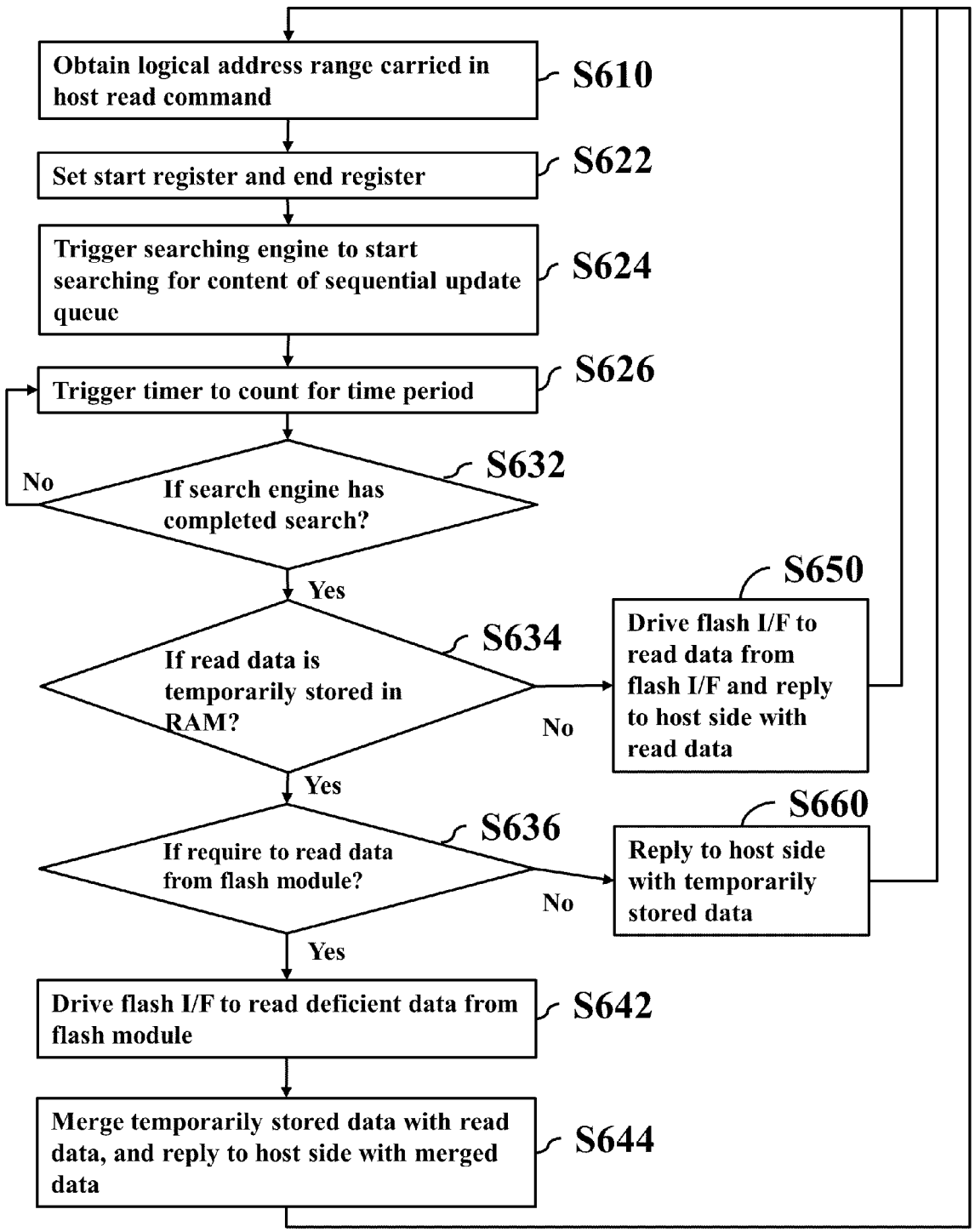
FIG. 6 is a flowchart illustrating a method for executing host read commands with the search engine according to an embodiment of the invention.

The dedicated search engine 135 accompanying with the compact data structure for the entries of the sequential update queue 310 can be applied to the execution of host read commands. With reference made to the flowchart of executing host read commands as shown in FIG. 6, the method performed by the processing unit 134 when loading and executing the program code of FTL repeatedly receives host read commands from the host side 110 and employs the sequential update queue 310 and the search engine 135 to accelerate the executions of host read commands. The details are as follows:

Step S610: A logical address range carried in a host read command is obtained.

Step S622: The start logic address "startA" and the end logic address "endA" of the logic address range are set to the start register 511 and the end register 512, respectively.

Step S624: The activation register 521 is set for driving the search engine 135 to start searching for the content of the sequential update queue 310, so as to determine whether the whole or a portion of the logical address range of this host read command is found in the sequential update queue 310.

Step S626: A timer is triggered to count for a period of time. During the time period, the FTL may jump to execute another host command or background operations without waiting for the execution results generated by the search engine 135.

Step S632: The value of the status register 526 is read to determine whether the search engine 135 has completed the search. If the value of the status register 526 is logical "0" (representing that the search engine 135 is currently in the idle state), the process proceeds to step S634. If the value of the status register 526 is logical "1" (representing that the search engine 135 is currently in the busy state), the process proceeds to step S626.

Step S634: The value of the matching register 515 is read to determine whether the data corresponding to the obtained logical address range is temporarily stored in the RAM 136. If the value of the matching register 515 is logic "1" (representing at least portion of the read data is found in temporarily stored data), then the process proceeds to step S636. If the value of the matching register 515 is logic "0" (the read data is not found in temporarily stored data), then the process proceeds to step S650.

Step S636: It is determined whether to read data from the flash module 150. If so, the process proceeds to step S642. Otherwise, the process proceeds to step S660. The FTL reads the memory address stored in the resulting address register 516 and reads the start logic address "startB" of 4 bytes and the end logic address "endB" of 4 bytes starting from the read memory address of the RAM 136. The FTL determines whether the logical address range from startA to endA is fully included in the logical address range startB and endB. If so, it means that the data of the logical address range from startA to endA is fully stored in the RAM 136 and it is unnecessary to read data from the flash module 150. Otherwise, it means that a partial of the data of the logical address range from startA to endA hasn't been stored in the RAM 136 and it is necessary to read the partial data from the flash module 150.

Step S642: The flash I/F 139 is driven to read the deficient data (that is, the data of the logical address range from startC to endC of the logical address range from startA to endA that is not overlapped with that from startB to endB) from the flash module 150.

Step S644: The data temporarily stored in the RAM 136 is merged with the data read from the flash module 150, and the host I/F 131 is driven to reply to the host side 110 with the merged data.

Step S650: The flash I/F 139 is driven to read needed data (that is, the data of the logical address range from startA to endA) from the flash module 150, and the host I/F 131 is driven to reply to the host side 110 with the read data.

Step S660: The temporarily stored data (that is, the data of the logical address range from startA to endA) is read from the RAM 136, and the host I/F 131 is driven to reply to the host side 110 with the read data.

For example, the FTL receives the host read command requesting to read the data of the logical addresses ranging from "0x800" to "0xFFF" (step S610), sets the values of the start register 511 and the end register 512, so that startA="0x800" and endA="0xFFF" (step S622), and sets the activation register 521 to logic "1" to drive the search engine 135 to start searching for the content of the sequential update queue 310 for determining whether the logic address range of this host read command is found in the sequential update queue 310 (step S624). After driving the search engine 135 through the activation register 521 (step S624) and triggering the timer (step S626), the FTL may interrupt the execution of this host read command and start performing other tasks. After the timer has counted for the time period, the FTL reads the values of the status register 526, the matching register 515 and the resulting address register 516 to know the entry that is hit by the requested logical address range from startA="0x800" to endA="0xFFF" is stored in the memory address "0x41008" of the RAM 136. Subsequently, the FTL determines that the logical address range from startA="0x800" to endA="0xFFF" is partially overlapped with the logical address range from startB="0x8C0" to endB="0x8DF" of the first sequential update command (the "Yes" path of step S636). The FTL searches for the H2F table to obtain the physical addresses mapped by the logical address range from "0x800" to "0x8BF" and the logical address range from "0x8E0" to "0xFFF" and drives the flash I/F 139 to read data from the obtained physical addresses of the flash module 150 (step S642). The FTL further reads the to-be-programmed data of the logical address range from "0x8C0" to "0x8DF" from the space Buf #1 in the data buffer 330 according to the content of host-command basic-data table, merges the temporarily stored data with the read data, and drives the host I/F 131 to reply to the host side 110 with the merged data (step S644).

Figure 7:
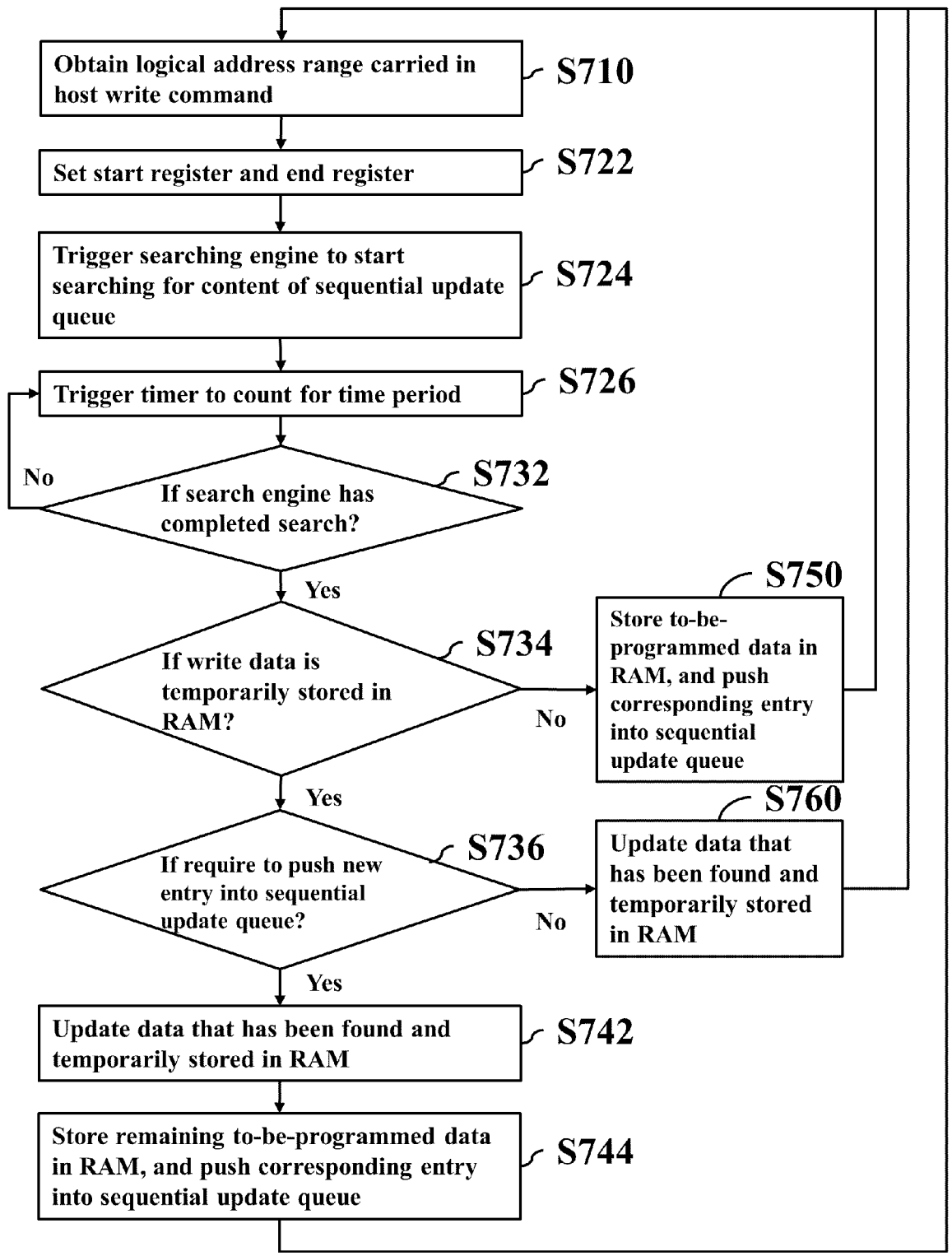
FIG. 7 is a flowchart illustrating a method for executing host write commands with the search engine according to an embodiment of the invention.

The dedicated search engine 135 accompanying with the compact data structure for the entries of the sequential update queue 310 can be applied to the execution of host write commands. With reference made to the flowchart of executing host write commands as shown in FIG. 7, the method performed by the processing unit 134 when loading and executing the program code of FTL repeatedly receives host write commands from the host side 110 and employs the sequential update queue 310 and the search engine 135 to accelerate the executions of host write commands. The details are as follows:

Step S710: A logical address range carried in a host write command is obtained.

The technical details of steps S722, S724, S726, S732 and S734 may refer to the description of steps S622, S624, S626, S632 and S634 in FIG. 6, and are not repeated herein for the brevity.

Step S736: It is determined whether to push new entry into the sequential update queue 310. If so, the process proceeds to step S742. Otherwise, the process proceeds to step S760. The FTL reads the memory address stored in the resulting address register 516 and reads the start logic address "startB" of 4 bytes and the end logic address "endB" of 4 bytes starting from the read memory address of the RAM 136. The FTL determines whether the logical address range from startA to endA is fully included in the logical address range startB and endB. If so, it means that the data of the logical address range from startA to endA is fully stored in the RAM 136 and it is unnecessary to push new entry into the sequential update queue 310. Otherwise, it means that a partial of the data of the logical address range from startA to endA hasn't been stored in the RAM 136 and it requires to temporarily store the data of the non-overlapping logical address range in available space of the data buffer 330 and pushes at least one new entry into the sequential update queue 310 to reflect the newly stored data that is to be programmed.

Step S742: The data that has been found and temporarily stored in the RAM 136 (that is, the data of the logical address range from startC to endC of the logical address range from startA to endA that is overlapped with that from startB to endB) is updated.

Step S744: The remaining to-be-programmed data (that is, the data of at least one logical address range from startD to endD of the logical address range from startA to endA that is not overlapped with that from startB to endB) is stored in the newly allocated space in the data buffer 330, and at least one new entry including the logical address range from startD to endD is pushed into the sequential update queue 310.

Step S750: The to-be-programmed data of the logical address range from startA to endA is stored in the newly allocated space in the data buffer 330, and a new entry including the logical address range from startA to endA is pushed into the sequential update queue 310.

Step S760: The data that has been found and temporarily stored in the RAM 136 (that is, the data of the logical address range from startA to endA) is updated.

Figure 8:
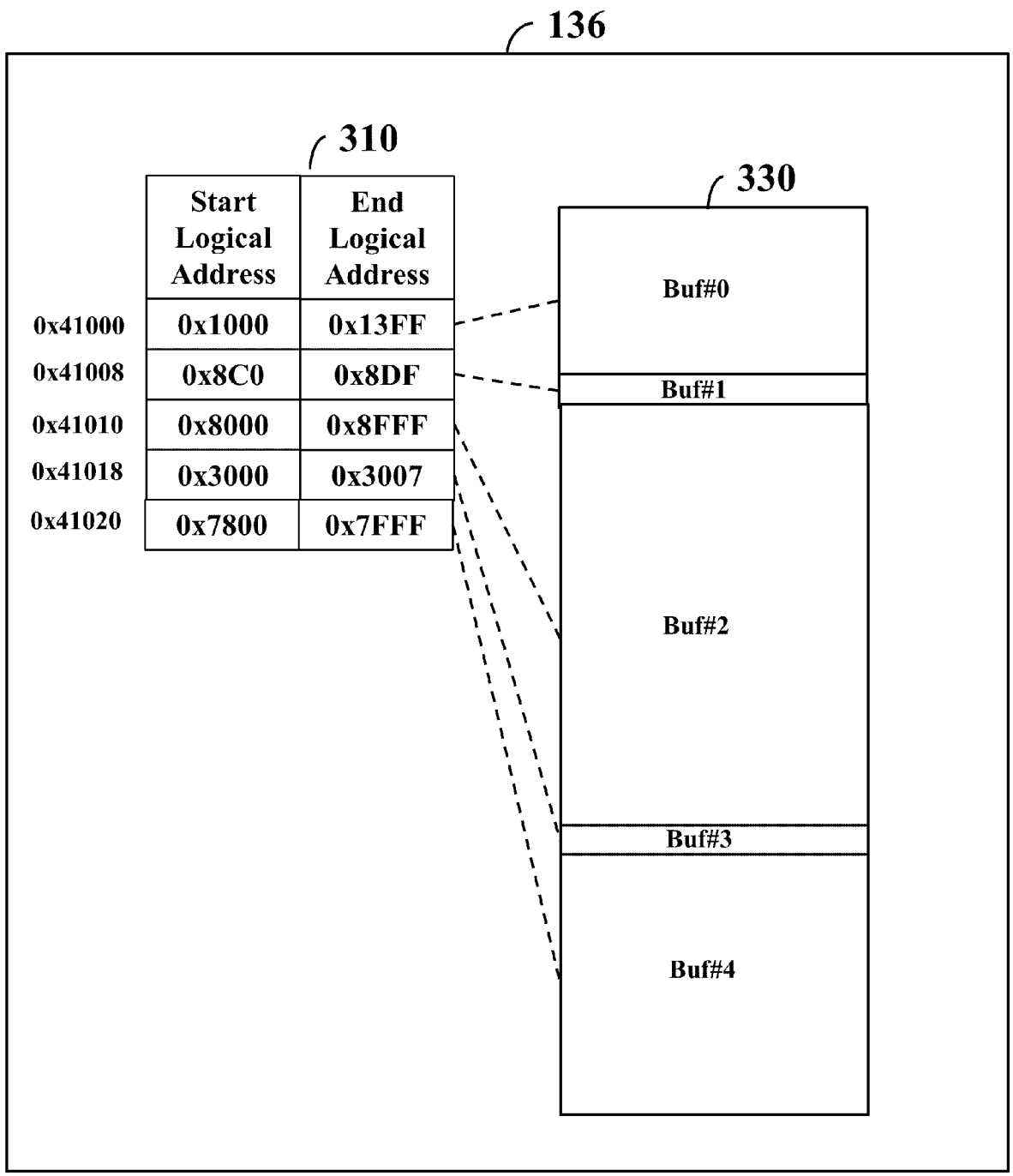
FIG. 8 is a schematic diagram showing the relations between the exemplary entries in a sequential update queue and the exemplary space allocations in a data buffer after executing the exemplary host write command according to an embodiment of the invention.

For example, the FTL receives the host write command requesting to write the data of the logical addresses ranging from "0x7800" to "0x83FF" into the flash module 150 (step S710), sets the values of the start register 511 and the end register 512, so that startA="0x7800" and endA="0x83FF" (step S722), and sets the activation register 521 to logic "1" to drive the search engine 135 to start searching for the content of the sequential update queue 310 for determining whether the logic address range of this host write command is found in the sequential update queue 310 (step S724). After driving the search engine 135 through the activation register 521 (step S724) and triggering the timer (step S726), the FTL may interrupt the execution of this host write command and start performing other tasks. After the timer has counted for the time period, the FTL reads the values of the status register 526, the matching register 515 and the resulting address register 516 to know the entry that is hit by the requested logical address range from startA="0x7800" to endA="0x83FF" is stored in the memory address "0x41010" of the RAM 136. Subsequently, the FTL determines that the logical address range from startA="0x7800" to endA="0x83FF" is partially overlapped with the logical address range from startB="0x8000" to endB="0x9FF" of the second sequential update command (the "Yes" path of step S736). The FTL updates the data of the logical address range from "0x8000" to "0x83FF" that is temporarily stored in the space Buf #2 in the data buffer 330 with the to-be-programmed data of the logical address range from "0x8000" to "0x83FF" of this host write command (step S742). The FTL further stores the to-be-programmed data of the logical address range from "0x7800" to "0x7FFF" in the newly allocated space Buff #4 in the data buffer 330, and pushes the 4th entry into the sequential update queue 310 (step S744). The executed outcome may refer to FIG. 8 showing the schematic diagram of allocating memory space.

Some or all of the aforementioned embodiments of the method of the invention may be implemented in a computer program such as a driver for a dedicated hardware, a Firmware Translation Layer (FTL) of a storage device, or others. Other types of programs may also be suitable, as previously explained. Since the implementation of the various embodiments of the present invention into a computer program can be achieved by the skilled person using his routine skills, such an implementation will not be discussed for reasons of brevity. The computer program implementing some or more embodiments of the method of the present invention may be stored on a suitable computer-readable data carrier such as a DVD, CD-ROM, USB stick, a hard disk, which may be located in a network server accessible via a network such as the Internet, or any other suitable carrier.

Although the embodiment has been described as having specific elements in FIGS. 1-2 and 4-5, it should be noted that additional elements may be included to achieve better performance without departing from the spirit of the invention. Each element of FIGS. 1-2 and 4-5 is composed of various circuits and arranged to operably perform the aforementioned operations. While the process flows described in FIGS. 6 and 7 include a number of operations that appear to occur in a specific order, it should be apparent that these processes can include more or fewer operations, which can be executed serially or in parallel (e.g., using parallel processors or a multi-threading environment).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An apparatus for searching for logical address ranges of host commands, comprising:
  a second start register, arranged operably to store a second start logical address;
  a second end register, arranged operably to store a second end logical address;
  a first comparator comprising a first input terminal, a second input terminal and a first output terminal, wherein the first input terminal is coupled to a first end register, the second input terminal is coupled to the second start register, and the first output terminal is arranged operably to output logic "0" to a NOR gate when a first end logical address stored in the first end register is not smaller than the second start logical address;
  a second comparator comprising a third input terminal, a fourth input terminal and a second output terminal, wherein the third input terminal is coupled to the second end register, the fourth input terminal is coupled to a first start register, and the second output terminal is arranged operably to output logic "0" to the NOR gate when the second end logical address is not smaller than a first start logical address stored in the first start register;
  the NOR gate comprising a fifth input terminal, a sixth input terminal and a third output terminal, wherein the fifth input terminal is coupled to the first output terminal, the sixth input terminal is coupled to the second output terminal, and the third output terminal is arranged operably to output logic "1" to a matching register and an output circuitry when both the fifth input terminal and the sixth input terminal receive logic "0"; and
  the output circuitry, arranged operably to output a memory address of a random access memory (RAM) storing a second logical address range from the second start logical address to the second end logical address to a resulting address register when receiving logic "1" from the NOR gate.

2. The apparatus of claim 1, comprising:
  a D flip-flop, comprising a seventh input terminal and a fourth output terminal, wherein the seventh input terminal is coupled to the third output terminal, and the fourth output terminal is coupled to the matching register and is arranged operably to: output logic "0" to the matching register when the seventh input terminal receives logic "0"; and output logic "1" to the matching register when the seventh input terminal receives logic "1".

3. The apparatus of claim 2,
  wherein data of a first logical address range from the first start logical address to the first end logical address is not temporarily stored in the RAM when the matching register stores logic "0", and wherein a whole or a portion of data of the first logical address range is temporarily stored in the RAM when the matching register stores logic "1".

4. The apparatus of claim 2, comprising:
an activation register, arranged operably to allow a processing unit to activate the apparatus, and when set, output an enabling signal to the D flip-flop to start outputting signal to the matching register.

5. The apparatus of claim 4, comprising:
a status register, coupled to the activation register and the NOR gate, arranged operably to: store logic "1" to indicate that the apparatus is currently in a busy state when the activation register is set; and store logic "0" to indicate that the apparatus is currently in an idle state when the NOR gate outputs logic "1".

6. The apparatus of claim 1,
wherein a processing unit is arranged operably to: when executing a host command, store the first start logical address to the first start register, and store the first end logical address to the first end register, and
wherein the first logical address range ranges from the first start logical address to the first end logical address.

7. The apparatus of claim 4, comprising:
the first start register; and
the first end register.

8. The apparatus of claim 1, comprising:
the matching register; and
the resulting address register.

9. The apparatus of claim 1, wherein the first comparator is arranged operably to output logic "1" to the NOR gate when the first end logical address is smaller than the second start logical address, and the second comparator is arranged operably to output logic "1" to the NOR gate when the second end logical address is smaller than the first start logical address.

10. The apparatus of claim 9, wherein the NOR gate is arranged operably to output logic "0" to the matching register and the output circuitry when at least one of the fifth input terminal and the sixth input terminal receives logic "1".

11. The apparatus of claim 1, wherein to-be-programmed data of the second logical address range is temporarily stored in a data buffer in the RAM but hasn't been programmed into a flash module.

12. The apparatus of claim 11, wherein the second logical address range is stored in an entry of a sequential update queue in the RAM.

13. A method for searching for logical address ranges of host commands, comprising:
inputting a first logical address range from a first start logical address to a first end logical address;
inputting a second logical address range from a second start logical address to a second end logical address, wherein to-be-programmed data of the second logical address range is temporarily stored in a random access memory (RAM) but hasn't been programmed into a flash module;
outputting, by a first comparator, logic "0" to a NOR gate when detecting that the first end logical address is not smaller than the second start logical address;
outputting, by a second comparator, logic "0" to the NOR gate when detecting that the second end logical address is not smaller than the first start logical address;
outputting, by the NOR gate, logic "1" to a matching register to notify a processing unit that a whole or a portion of data of the first logical address range is temporarily stored in the RAM, and outputting, by the NOR gate, logic "1" to an output circuitry to allow the output circuitry to output a memory address of the RAM storing the second logical address range to a resulting address register when receiving logic "0" from both the first comparator and the second comparator.

14. The method of claim 13,
wherein data of the first logical address range is not temporarily stored in the RAM when the matching register stores logic "0", and
wherein a whole or a portion of data of the first logical address range is temporarily stored in the RAM when the matching register stores logic "1".

15. The method of claim 13, wherein the to-be-programmed data of the second logical address range is temporarily stored in a data buffer of the RAM.

16. The method of claim 13, wherein the second logical address range is stored in an entry of a sequential update queue in the RAM.

17. The method of claim 16, wherein the first start logical address and the first end logical address are set by a processing unit.

18. The method of claim 13, comprising:
outputting, by the first comparator, logic "1" to the NOR gate when detecting that the first end logical address is smaller than the second start logical address; and
outputting, by the second comparator, logic "1" to the NOR gate when detecting that the second end logical address is smaller than the first start logical address.

19. The method of claim 18, comprising:
outputting, by the NOR gate, logic "0" to the matching register to notify the processing unit that the whole data of the first logical address range is not temporarily stored in the RAM when receiving logic "1" from at least one of the first comparator and the second comparator.

20. The method of claim 19, comprising:
outputting, by the NOR gate, logic "0" to an output circuitry to disallow the output circuitry to output any address to the resulting address register when receiving logic "1" from at least one of the first comparator and the second comparator.

* * * * *